(12) United States Patent
Sheen et al.

(10) Patent No.: US 11,303,260 B1
(45) Date of Patent: Apr. 12, 2022

(54) COUPLED RESONATOR FILTER WITH HIGH QUALITY FACTOR

(71) Applicant: ADVANCED CERAMIC X CORPORATION, Hsinchu County (TW)

(72) Inventors: Jyh-Wen Sheen, Hsinchu County (TW); Chih-Ming Chang, Hsinchu County (TW)

(73) Assignee: ADVANCED CERAMIC X CORPORATION, Hsinchu (TW)

( * ) Notice: Subject to any disclaimer, the term of this patent is extended or adjusted under 35 U.S.C. 154(b) by 0 days.

(21) Appl. No.: 17/176,255

(22) Filed: Feb. 16, 2021

(30) Foreign Application Priority Data

Oct. 14, 2020 (TW) ................. 109135506

(51) Int. Cl.
*H03H 7/01* (2006.01)
*H03H 1/00* (2006.01)

(52) U.S. Cl.
CPC ........ *H03H 7/0115* (2013.01); *H03H 7/0161* (2013.01); *H03H 2001/0085* (2013.01)

(58) Field of Classification Search
CPC ......... H03H 2001/0085; H03H 7/0115; H03H 7/0161
USPC .................................................. 333/175, 185
See application file for complete search history.

(56) References Cited

U.S. PATENT DOCUMENTS

| 5,917,387 A * | 6/1999 | Rice .................... | H03H 7/0115 333/174 |
| 2015/0162888 A1* | 6/2015 | Yunoki ................ | H03H 7/0161 333/174 |

\* cited by examiner

*Primary Examiner* — Rakesh B Patel

(57) ABSTRACT

A coupled resonator filter is disclosed. The coupled resonator filter is provided with high quality factor, and comprises: a first resonance unit, a second resonance unit and a main adjustment unit. In the present invention, the main adjustment unit is electrically connected between the first resonance unit and the second resonance unit, and comprises an adjustable capacitor. By changing a capacitance of the adjustable capacitor, a coupling coefficient between the first resonance unit and the second resonance unit is adjusted. As a result, the coupled resonator filter of the present invention included advantages of high controllability of the frequency bandwidth and high inhibition rate of noise signal.

7 Claims, 14 Drawing Sheets

COUPLED RESONATOR FILTER WITH HIGH QUALITY FACTOR

BACKGROUND OF THE INVENTION

1. Field of the Invention

The present invention relates to the technology field of micro-electro-mechanical (MEMS) systems technology, and more particularly to a coupled resonator filter with high quality factor.

2. Description of the Prior Art

With advancement of the communications industry, the designs of the communication system have been developed towards miniaturization and low noise. Therefore, the demands of the communications industry and related industries for components with miniaturization, low-interference signal, and high inhibition rate of noise signal have been increasing.

Filters are widely used in electronics and the communications industry, and are used for allowing signals within the specified band of frequencies to pass. The filters have the function of attenuating frequencies outside the specified band of frequencies to filter out the interference signal. However, it is conceivable that, the miniaturization of the electronic components causes an increase in internal interference signals, thereby decreasing the inhibition rate of noise signal and quality factor of filters. Therefore, how to develop or design a filter having high quality factor and high inhibition rate of noise signal has become the most important technology development goal of each filter manufacturers and engineers.

From above descriptions, it is clear that, how to re-design and provide a filter with high quality factor has now become the most important issue. In view of that, inventors of the present application have made great efforts to make inventive research and eventually provided a coupled resonator filter with high quality factor.

SUMMARY OF THE INVENTION

The primary objective of the present invention is to provide a coupled resonator filter with high quality factor. The coupled resonator filter comprises: a first resonance unit, a second resonance unit, and a main adjustment unit. Wherein the main adjustment unit is electrically connected between the first resonance unit and the second resonance unit, and comprises an adjustable capacitor. By changing a capacitance of the adjustable capacitor, a coupling coefficient between the first resonance unit and the second resonance unit is adjusted. Moreover, according to particular design of the shielding conductive layer and shielding conductive columns, the coupled resonator filter of the present invention included advantages of high controllability of the frequency bandwidth and high inhibition rate of noise signal.

In order to achieve the primary objective of the present invention, the inventor of the present invention provides an embodiment for the coupled resonator filter, comprise:

a first resonance unit, being coupled to an input end, and comprising:
 a first resonance inductor, being coupled to a ground unit by a first end thereof; and
 a first capacitor, having a first end and a second end, and the first end and the second end being coupled to a second end of the first resonance inductor and the ground unit, respectively;

a second resonance unit, being electrically connected between the first resonance unit and an output end, and comprising:
 a second resonance inductor, being coupled to the ground unit by a first end thereof; and
 a second capacitor, having a first end and a second end, and the first end and the second end are coupled to a second end of the second resonance inductor and the ground unit, respectively; wherein a first signal transmitted in the first resonance inductor is coupled to the second resonance inductor of the second resonance unit; and a main adjustment unit, being electrically connected between the first resonance unit and the second resonance unit, and comprising an adjustable capacitor;

wherein the first resonance unit, the second resonance unit and the main adjustment unit be integrated in a main body, and the input end and the output end being extended out of the main body;

wherein the first resonance inductor and the second resonance inductor are both consisted of a plurality of conductive connection columns;

wherein by changing a capacitance of the adjustable capacitor, a coupling coefficient between the first resonance unit and the second resonance unit is adjusted, such that a center frequency and/or a frequency bandwidth of the coupled resonator filter is therefore adjusted.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a coupled resonator filter with high quality factor disclosed by the present invention, embodiments of the present invention will be described in detail with reference to the attached drawings hereinafter.

First Embodiment

Figure 1:
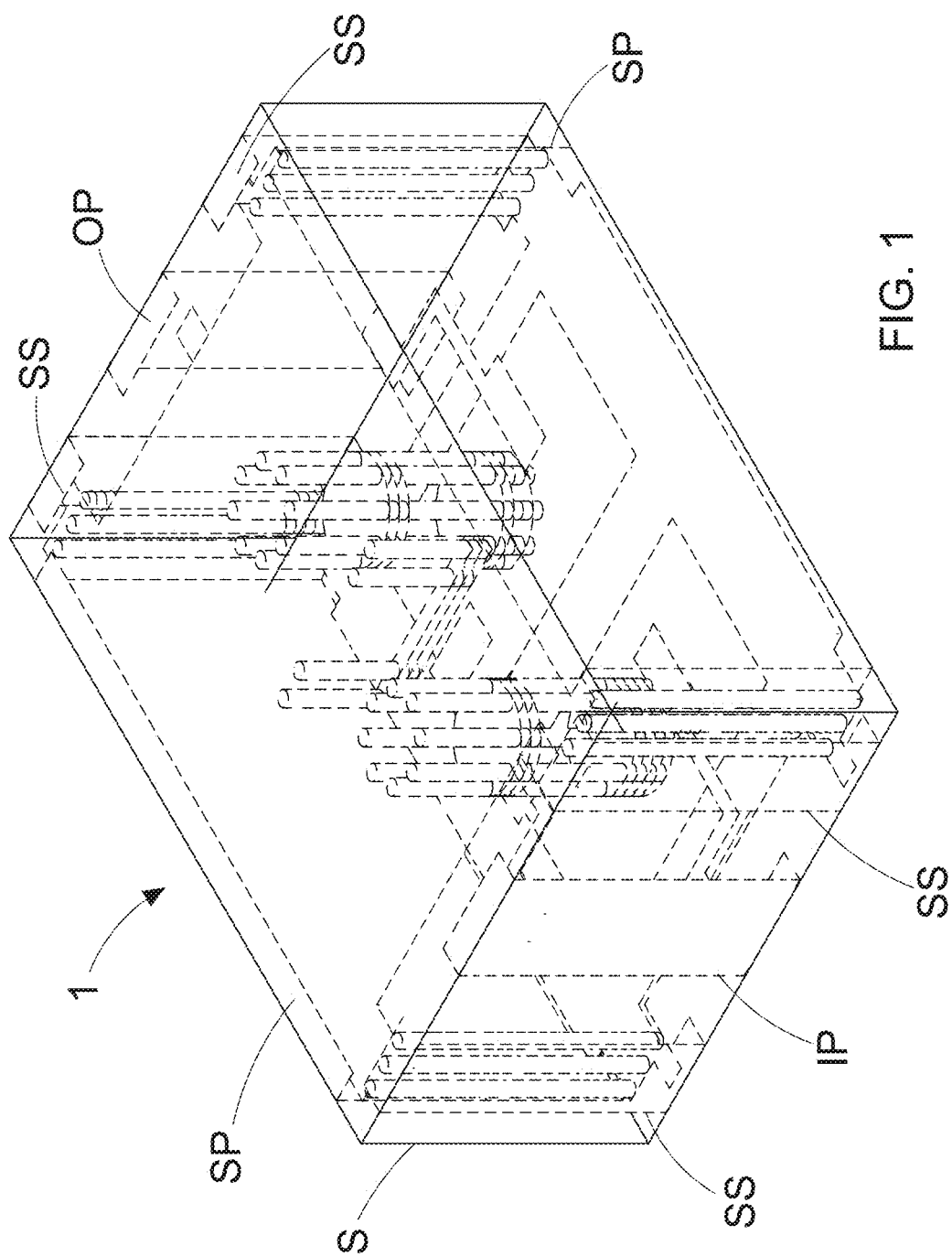
FIG. 1 shows a perspective view of a first embodiment of a coupled resonator filter with high quality factor according to the present invention.
Figure 2:
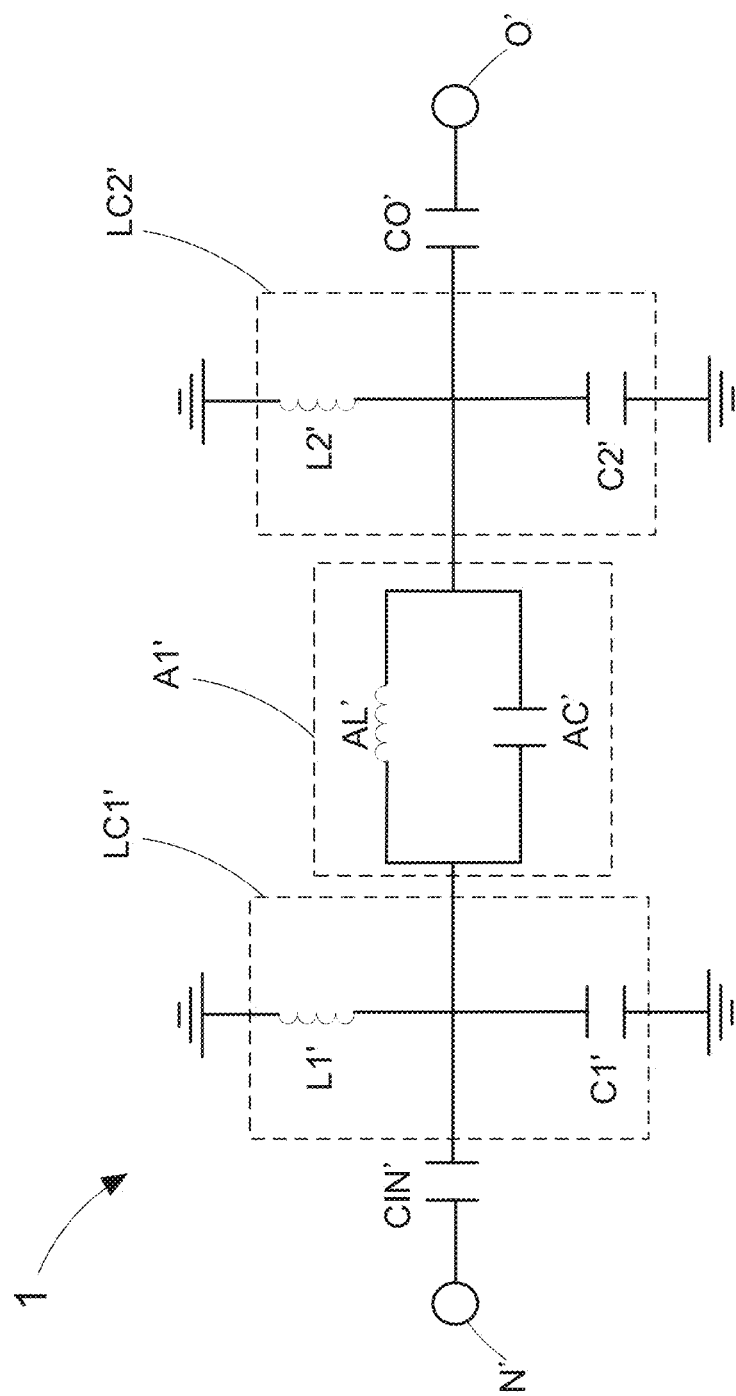
FIG. 2 shows an equivalent circuit diagram of the first embodiment of the coupled resonator filter.

With references to FIG. 1 and FIG. 2, there are provided a perspective view of a first embodiment of a coupled resonator filter with high quality factor and an equivalent circuit diagram of the first embodiment of the coupled resonator filter according to the present invention. The coupled resonator filter 1 of the present invention comprises: an input capacitor CIN', a first resonance unit LC1', a second resonance unit LC2', a main adjustment unit A1' and an output capacitor CO'. Particularly, the input capacitor CIN' has a first end and second end, and the first end and the second end are coupled to the first resonance unit LC1' and an input end N', respectively. Moreover, the second resonance unit LC2' is electrically connected between the first resonance unit LC1' and an output end O'. It is worth noting that, the main adjustment unit A1' is electrically connected between the first resonance unit LC1' and the second resonance unit LC2', and comprises an adjustable capacitor AC'. And the output capacitor CO' has a first end and second end, and the first end and the second end are coupled to the second resonance unit LC2' and the output end O', respectively. By such arrangements, the user be able to adjust the coupling coefficient between the first resonance unit LC1' and the second resonance unit LC2' by changing and adjusting a capacitance of the adjustable capacitor AC', such that a center frequency and/or a frequency bandwidth of the coupled resonator filter is therefore adjusted. As a result, the pole frequency of the coupled resonator filter 1 of the present invention can be adjusted to inhibit noise signal of different region more effectively. In other words, the coupled resonator filter of the present invention includes advantages of high controllability of the frequency bandwidth and high inhibition rate of noise signal.

More particularly, the first resonance unit LC1' comprises a first resonance inductor L1' and a first capacitor C1'. Moreover, the first resonance inductor L1' is coupled to a ground unit by a first end thereof. And the first capacitor C1' has a first end and a second end, and the first end and the second end are coupled to a second end of the first resonance inductor L1' and the ground unit, respectively. The second resonance unit LC2' comprises a second resonance inductor L2' and a second capacitor C2'. Similarly, the second resonance inductor L2' is coupled to a ground unit by a first end thereof. Moreover, the second capacitor C2' has a first end and a second end, and the first end and the second end are coupled to a second end of the second resonance inductor L2' and the ground unit, respectively. Wherein a first signal transmitted in the first resonance inductor L1' is coupled to the second resonance inductor L2' of the second resonance unit LC2'. On the other hand, the input capacitor CIN', the output capacitor CO', the first resonance unit LC1', the second resonance unit LC2' and the main adjustment unit A1' are integrated in a main body S, and the input end N' and the output end O' are extended out of the main body S. Moreover, the first resonance inductor L1' and the second resonance inductor L2' are both consisted of a plurality of conductive connection columns.

Figure 3:
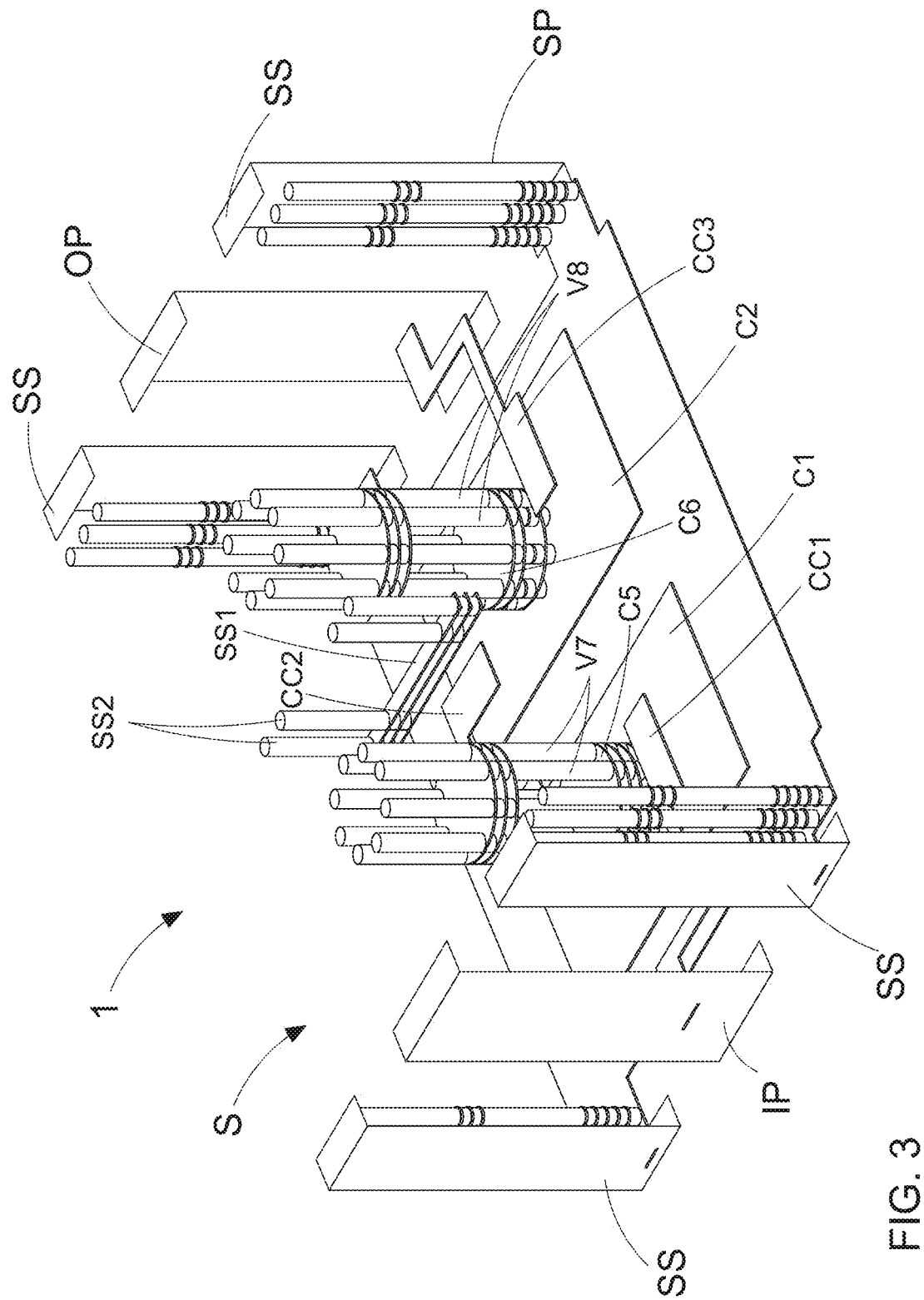
FIG. 3 shows a first exploded view of the first embodiment of the coupled resonator filter.

Inheriting to above descriptions, with reference to FIG. 3, there is provided a first exploded view of the first embodiment of the coupled resonator filter. From FIG. 1, FIG. 2, and FIG. 3, it is understood that the main body S is consisted of a plurality of dielectric plates, and the plurality of dielectric plates comprise: a first plate S1, a second plate S2, a third plate S3, and a fourth plate S4. Wherein the first plate S1 has a first ground layer G1 thereon. Moreover, the second plate S2 is stacked on the first plate S1, and has a first conductive layer C1 and a second conductive layer C2 thereon. Moreover, a plurality of first conductive columns V1 are disposed on the first conductive layer C1, and a plurality of second conductive columns V2 are disposed on the second conductive layer C2. It needs to further explain that the third plate S3 is stacked on the second plate S2, and has: a third conductive layer C3, a fourth conductive layer C4, a first capacitance layer CC1, a second capacitance layer CC2, and a third capacitance layer CC3 thereon. Wherein a plurality of third conductive columns V3 are disposed on the third conductive layer C3, and a plurality of fourth conductive columns V4 are disposed on the fourth conductive layer C4. Moreover, the fourth plate S4 is stacked on the third plate S3, and is provided with a second ground layer G2, a plurality of fifth conductive columns V5 and a plurality of sixth conductive columns V6 thereon.

From FIG. 2 and FIG. 3, it is understood that there are an input plate IP and an output plate OP attached onto two opposite sides of the main body S. Moreover, the plurality of first conductive columns V1, the plurality of third conductive columns V3 and the plurality of fifth conductive columns V5 are connected to each other for equivalently forming the first resonance inductor L1' of the first resonance unit LC1'. Similarly, the plurality of second conductive columns V2, the plurality of fourth conductive columns V4 and the plurality of sixth conductive columns V6 are connected to each other for equivalently forming the second resonance inductor L2' of the second resonance unit LC2'. More particularly, the first capacitance layer CC1, the input plate IP and first conductive layer C1 are equivalently formed the input capacitor CIN'. Moreover, the first capacitance layer C1 and first ground layer G1 are equivalently formed the first capacitor C1' of the first resonance unit LC1', and the second capacitance layer C2 and first ground layer G1 are equivalently formed the second capacitor C2' of the second resonance unit LC2'. It needs to further explain that, the third capacitance layer CC3, the output plate OP and the second conductive layer C2 are equivalently formed the output capacitor CO', and the second capacitance layer CC2, the first conductive layer C1 and the second conductive layer C2 are equivalently formed the adjustable capacitor AC'. More particularly, the second capacitance layer CC2 equivalently forms a main inductor AL' of the main adjustment unit A1', and the main inductor AL' is electrically connected with the adjustable capacitor AC' in parallel. The coupled resonator filter 1 further comprises a plurality of peripheral plates SS and two connection plates SP. Moreover, the plurality of peripheral plates SS are attached on the forgoing two opposite sides of the main body S and respectively adjacent to both sides of the input plate IP and the output plate. It is worth noting that, the two connection plates SP are connected between the first ground layer G1 of the first plate S1 and the second ground layer G2 of the fourth plate S4, such that the first ground layer G1 and the second ground layer G2 are equivalently formed the ground unit. Moreover, the two connection plates SP are attached onto the other two opposite sides of the main body, respectively.

Figure 4:
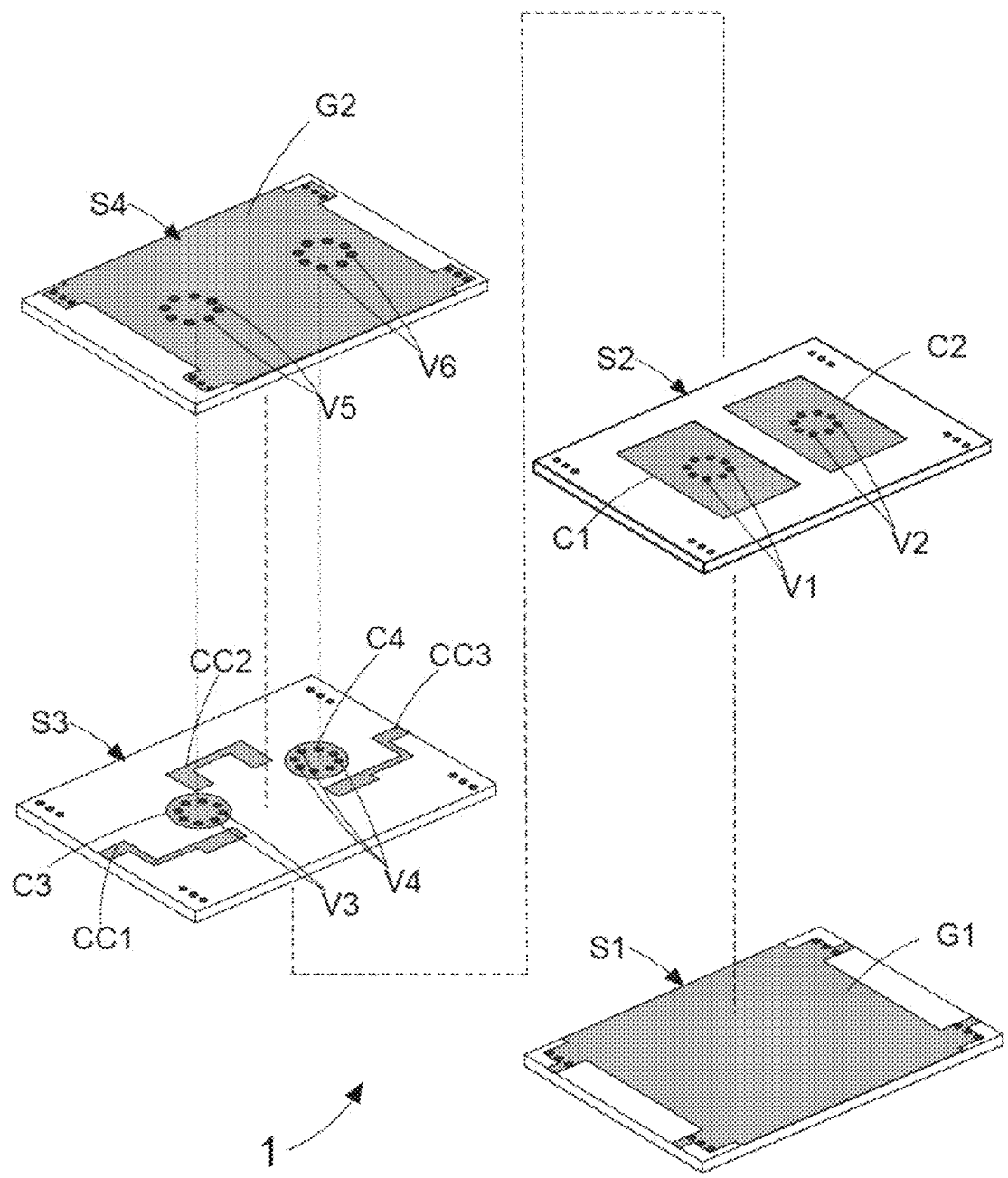
FIG. 4 shows a second exploded view of the first embodiment of the coupled resonator filter.

FIG. 4 shows a second exploded view of the first embodiment of the coupled resonator filter. According to FIG. 1, FIG. 2, FIG. 3 and FIG. 4, it is able to know that, the plurality of dielectric plates further comprise at least one extra plate, each of the extra plate has a fifth conductive layer C5 and a sixth conductive layer C6 thereon. Moreover, there are a plurality of seventh conductive columns V7 are disposed on the fifth conductive layer C5, and a plurality of eighth conductive columns V8 are disposed on the sixth conductive layer C6. In the implementations, the plurality of first conductive columns V1, the plurality of third conductive columns V3, the plurality of fifth conductive columns V5 and the plurality of seventh conductive columns V7 are connected to each other for equivalently forming the first resonance inductor L1' of the first resonance unit LC1'. Moreover, the plurality of second conductive columns V2, the plurality of fourth conductive columns V4, the plurality of sixth conductive columns V6 and the plurality of eighth conductive columns V8 are connected to each other for equivalently forming the second resonance inductor L2' of the second resonance unit LC2'. By such arrangements, the user is able to adjust the coupling coefficient between the first resonance unit LC1' and the second resonance unit LC2' by adding or removing the number of the extra plate, thereby obtaining the coupled resonator filter 1, which has advantages of high controllability of the frequency bandwidth and high inhibition rate of noise signal. More particularly, in some implementations of the present invention, there are three extra plate. In practical implementations, the user can change the number of the extra plate according to their needs.

FIG. 1, FIG. 2, FIG. 3, and FIG. 4 show that the plurality of dielectric plates further comprise at least one shield plate that is located between the third plate S3 and the fourth plate S4, and each of the shield plate comprises a seventh conductive layer, an eighth conductive layer and a shielding conductive layer SS1. Moreover, a plurality of ninth conductive columns are disposed on the seventh conductive layer, and a plurality of tenth conductive columns are disposed on the eighth conductive layer. As shown in FIG. 3, a plurality of first shielding conductive columns SS2 are disposed on the shielding conductive layer SS1. Therefore, the plurality of first conductive columns V1, the plurality of third conductive columns V3, the plurality of fifth conductive columns V5, the plurality of seventh conductive columns V7 and the plurality of ninth conductive columns V9 are connected to each other for equivalently forming the first resonance inductor L1' of the first resonance unit LC1'. And the plurality of second conductive columns V2, the plurality of fourth conductive columns V4, the plurality of sixth conductive columns V6, the plurality of eighth conductive columns V8 and the plurality of tenth conductive columns V10 are connected to each other for equivalently forming the second resonance inductor L2' of the second resonance unit LC2'. Moreover, the fourth plate S4 further has a plurality of second shielding conductive columns, and the second shielding conductive columns are connected to the plurality of first shielding conductive columns SS2. It is worth noting that, each of the plurality of the dielectric plates is a ceramics substrate.

Second Embodiment

Figure 5:
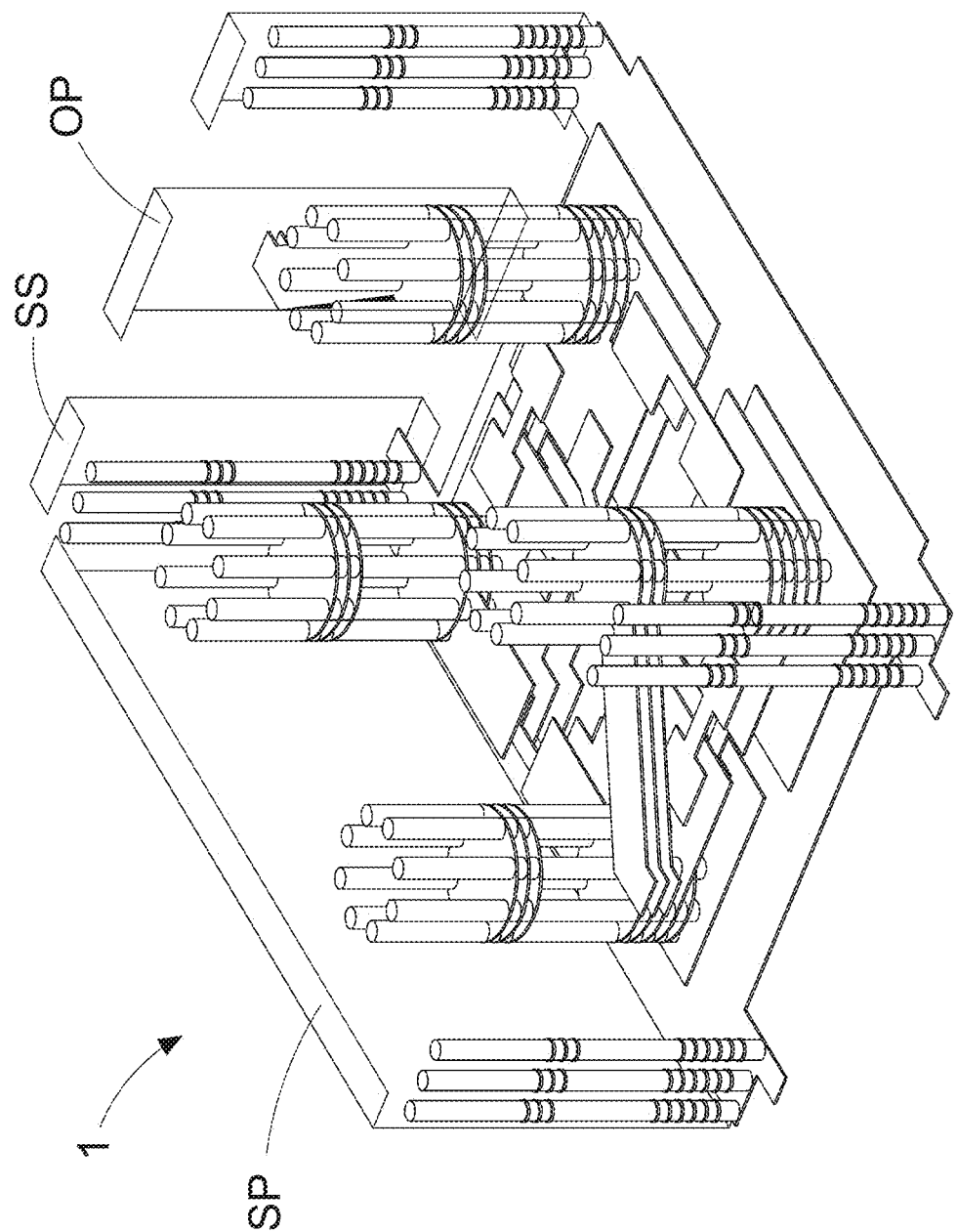
FIG. 5 shows a first stereo view of a second embodiment of the coupled resonator filter.
Figure 6:
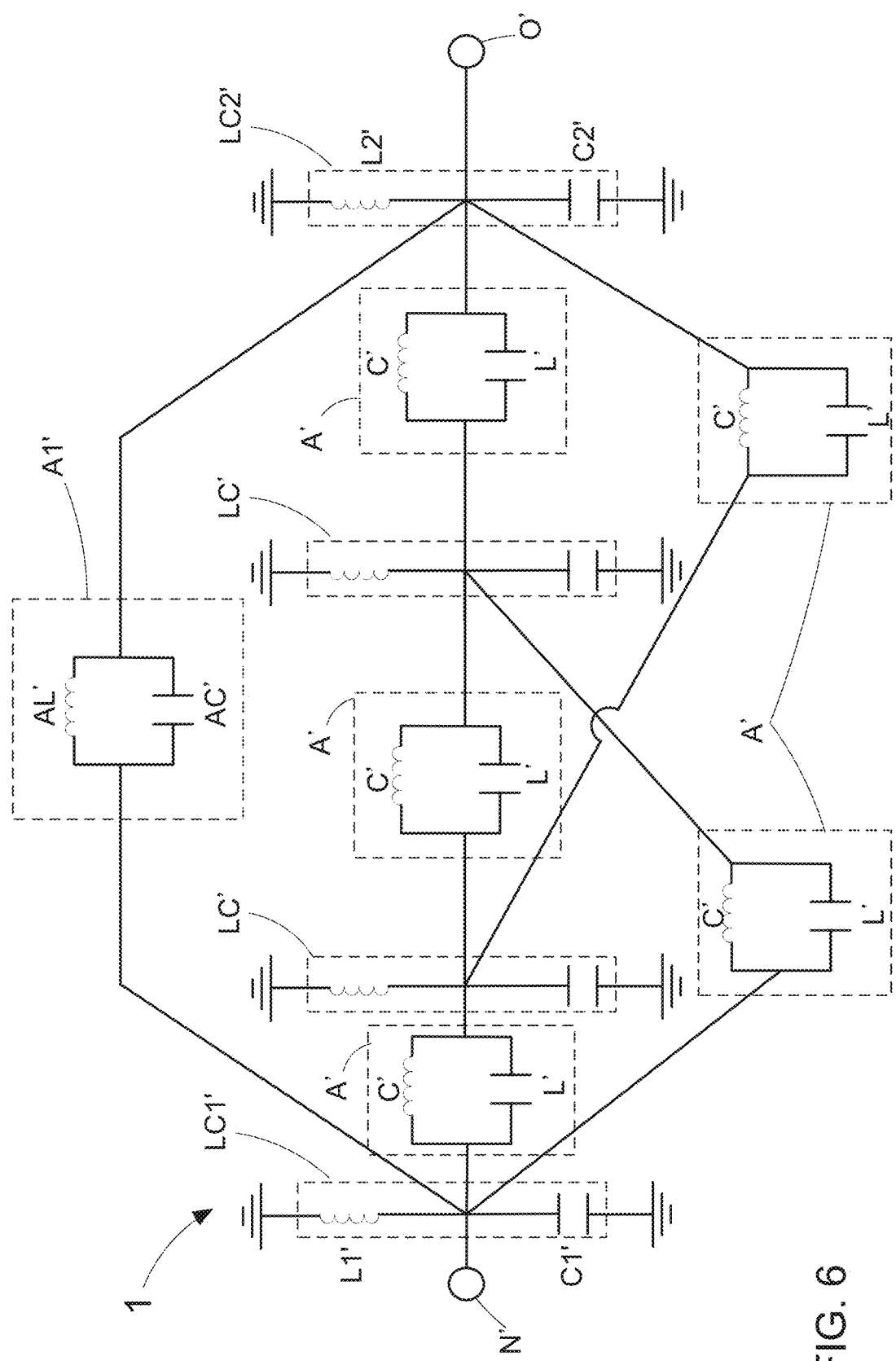
FIG. 6 shows a first equivalent circuit diagram of a second embodiment of the coupled resonator filter.

FIG. 5 shows a first stereo view of a second embodiment of the coupled resonator filter, and FIG. 6 shows a first equivalent circuit diagram of a second embodiment of the coupled resonator filter. After comparing FIG. 6 with FIG. 2, it is able to know that, the second embodiment further comprises a plurality of resonance elements LC' and a plurality of adjustment units A'. As shown in FIG. 6, the plurality of resonance element LC' are coupled between the first resonance unit LC1' and the second resonance unit LC2'. Moreover, each of the plurality of adjustment units A' is electrically connected between two of the resonance elements LC', between the resonance elements LC' and the first resonance unit LC1', and between the resonance elements LC' and the second resonance unit LC2', respectively. More particularly, in this implementation, there is two of the resonance elements LC', and five of the adjustment units A'. From FIG. 6, it is understood that each of the resonance units A' has a capacitor C' and an inductor L' that is in parallel with the capacitor A'.

Figure 7:
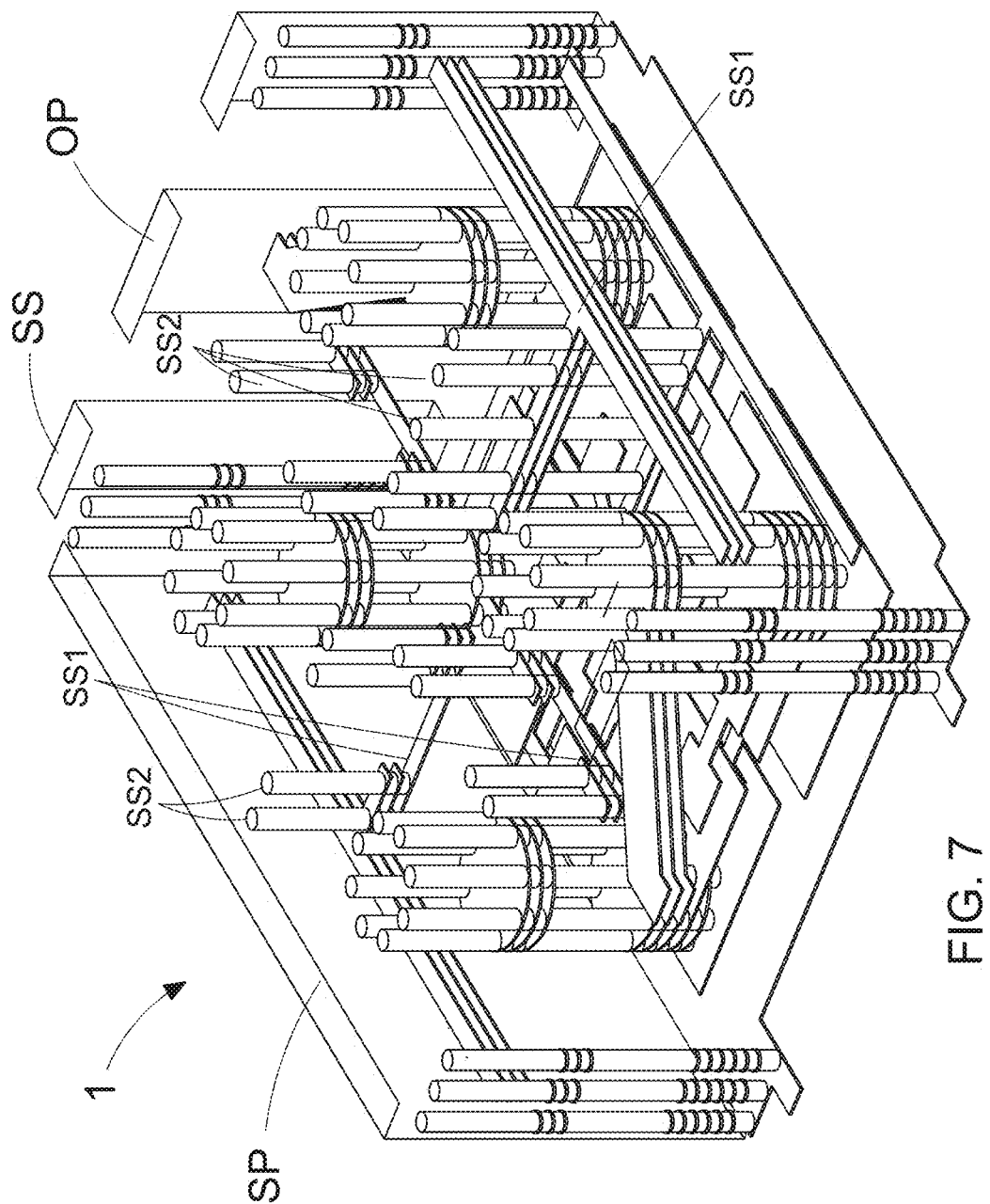
FIG. 7 shows a second stereo view of a second embodiment of the coupled resonator filter.
Figure 8:
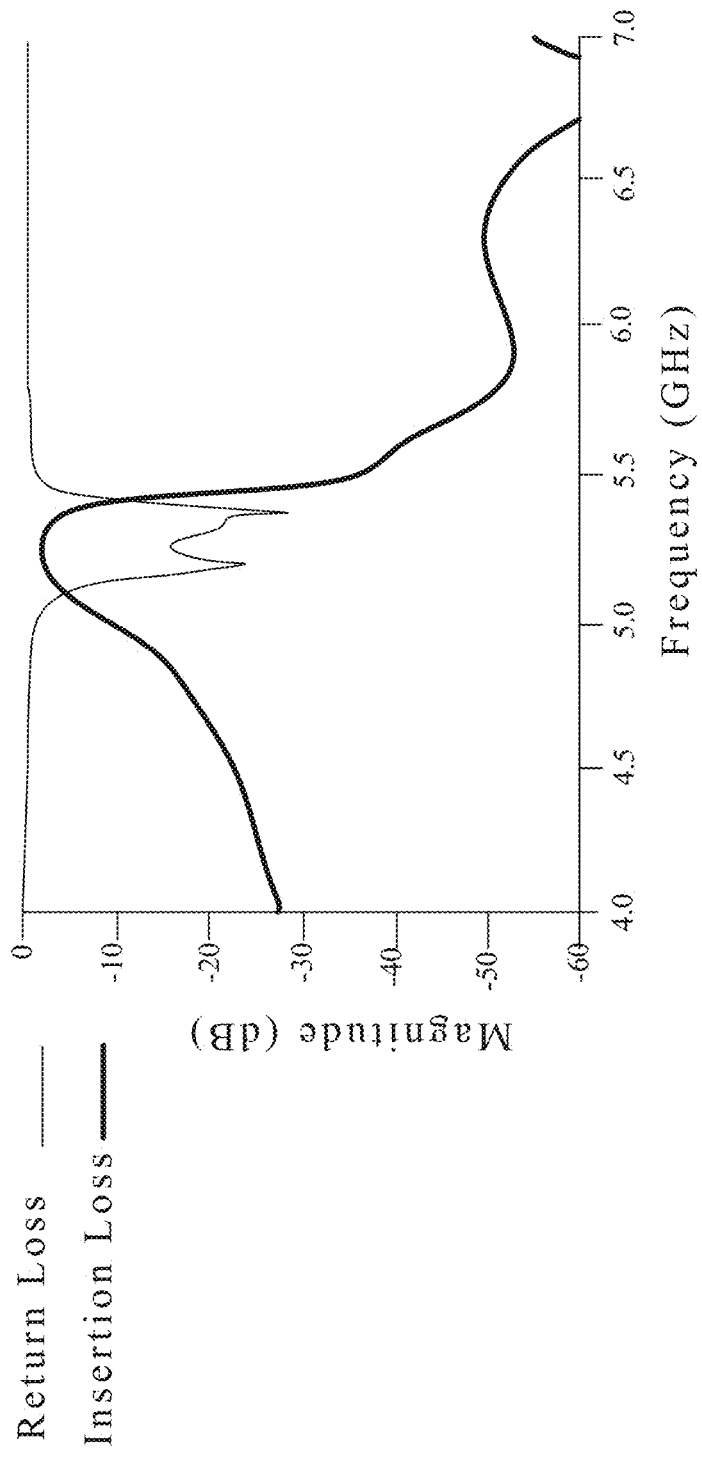
FIG. 8 shows a first frequency response graph of the coupled resonator filter.
Figure 9:
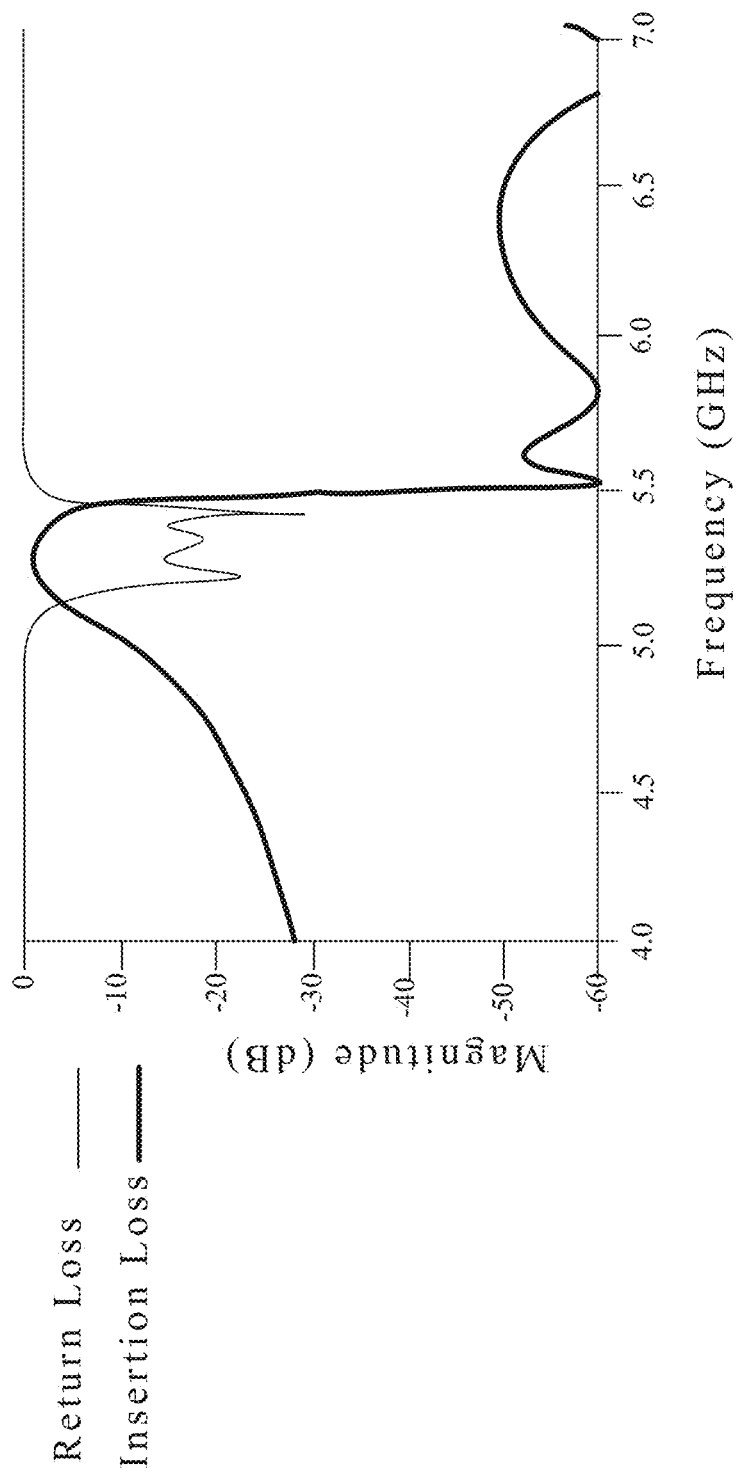
FIG. 9 shows a second frequency response graph of the coupled resonator filter.

FIG. 7 shows a second stereo view of a second embodiment of the coupled resonator filter. More particularly, FIG. 7 shows the coupled resonator filter 1 with the plurality of shielding conductive layer SS1 and the plurality of first shielding conductive columns SS2. Moreover, FIG. 8 shows a first frequency response graph of the coupled resonator filter, and FIG. 9 shows a second frequency response graph of the coupled resonator filter. Particularly, FIG. 8 shows a plot of the insertion loss and return loss of the coupled resonant filter without the plurality of shielding conductive layer SS1 and the plurality of first shielding conductive columns SS2 at the operating frequency range, and FIG. 9 shows a plot of the insertion loss and return loss of the coupled resonant filter with the plurality of shielding conductive layer SS1 and the plurality of first shielding conductive columns SS2 at the operating frequency range. After comparing FIG. 9 with FIG. 8, it is able to know that, the inhibition rate of noise signal shown in FIG. 9 is better than the inhibition rate of noise signal shown in FIG. 8 with a frequency range from 5.5 GHz to 6.0 GHz. In other words, the plurality of shielding conductive layer SS1 and the plurality of first shielding conductive columns SS2 of the present invention effectively adjust the amount of mutual inductance between two resonance unit, and appropriately isolate the excess mutual inductance, thereby letting the coupled resonator filter with high isolation.

Figure 10:
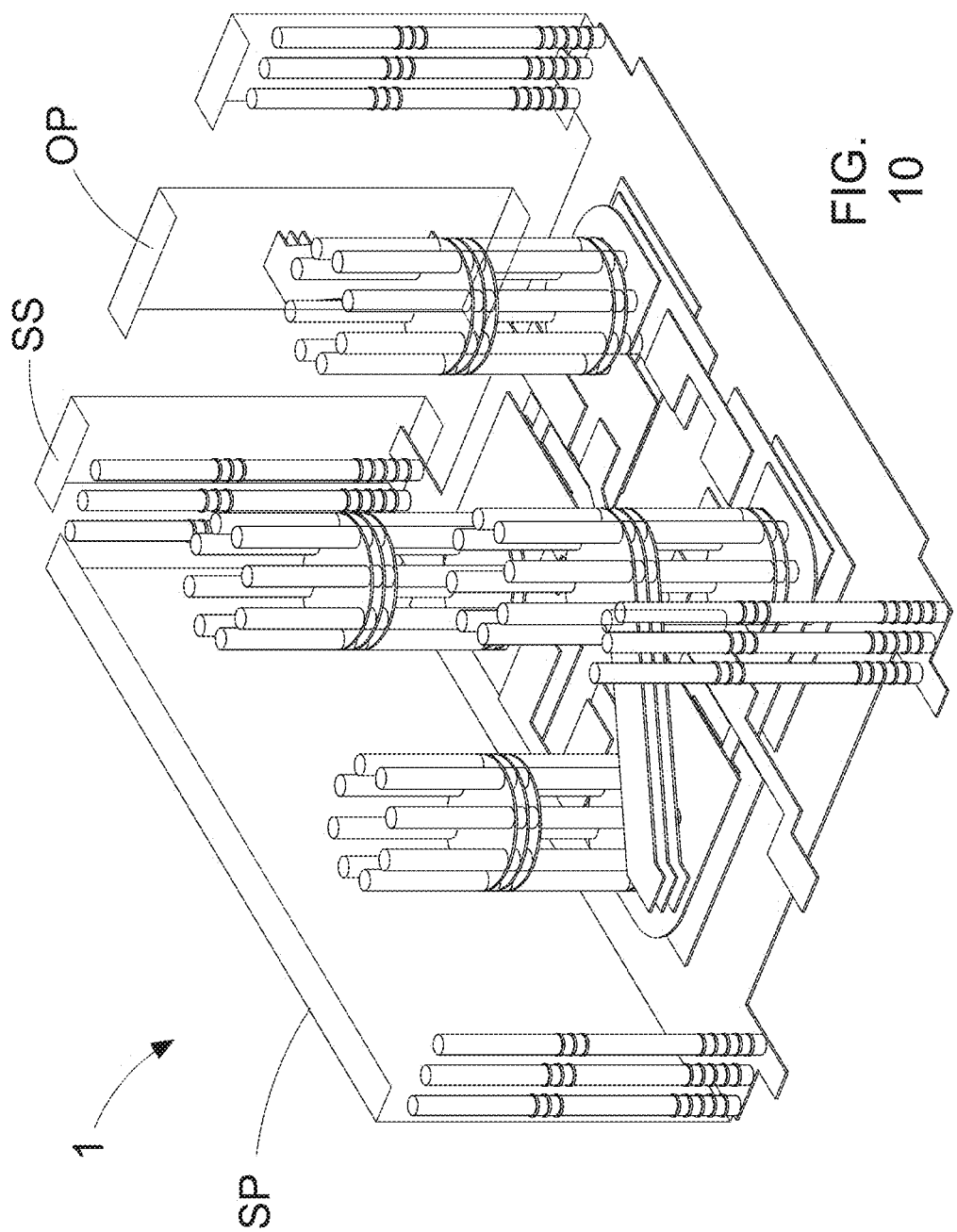
FIG. 10 shows a third stereo view of a second embodiment of the coupled resonator filter.
Figure 11:
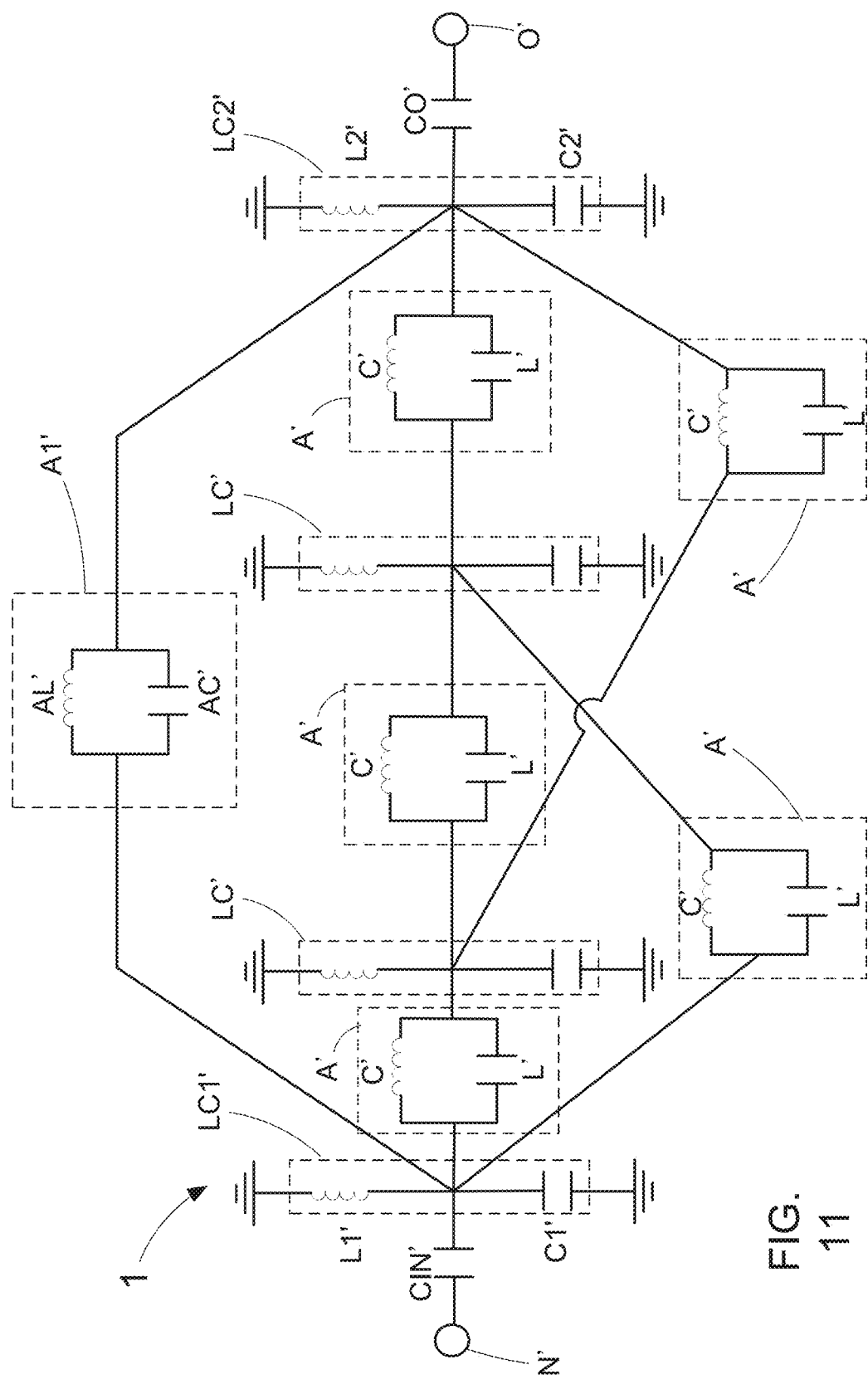
FIG. 11 shows a second equivalent diagram view of a second embodiment of the coupled resonator filter.
Figure 12:
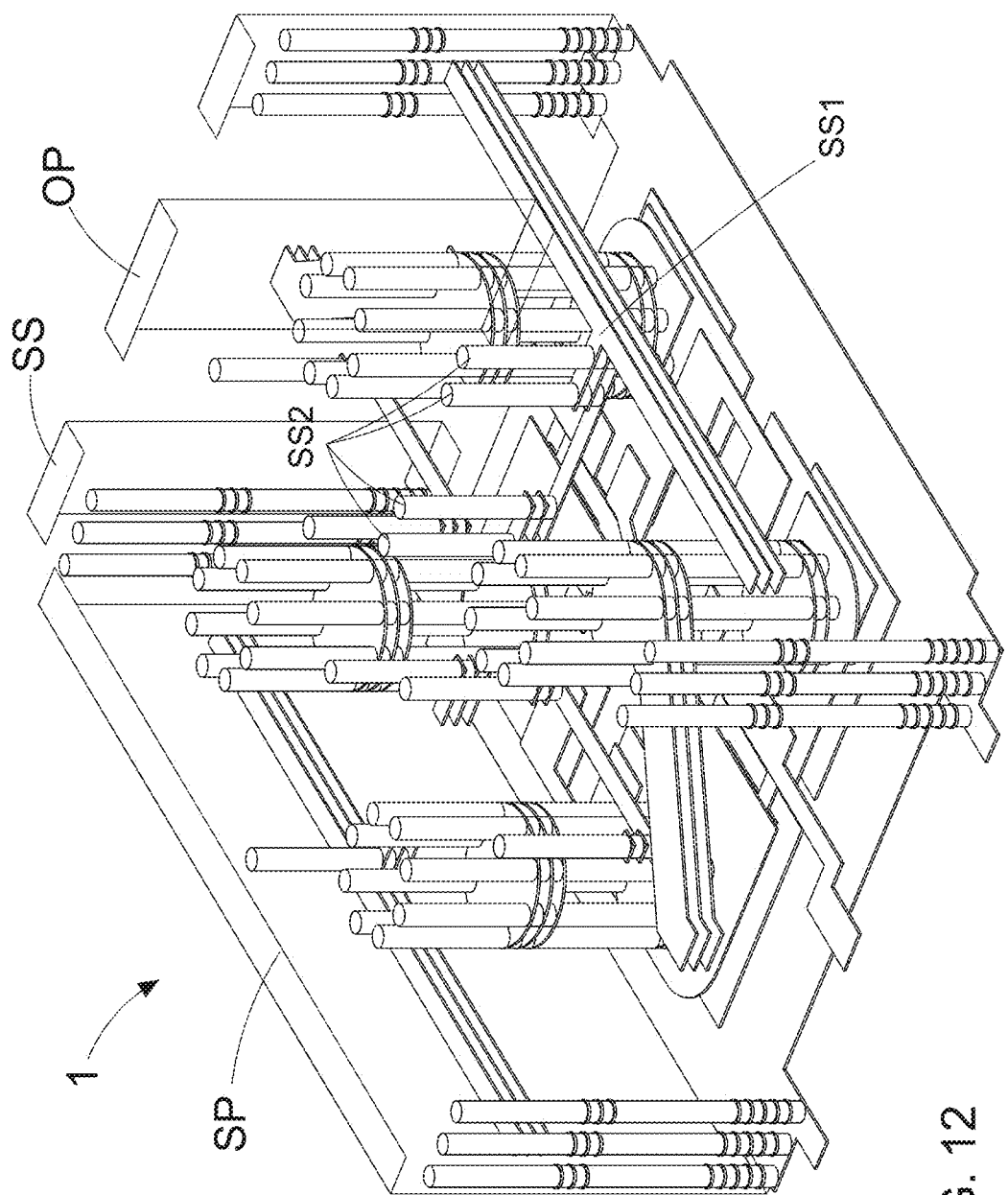
FIG. 12 shows a fourth stereo view of a second embodiment of the coupled resonator filter.
Figure 13:
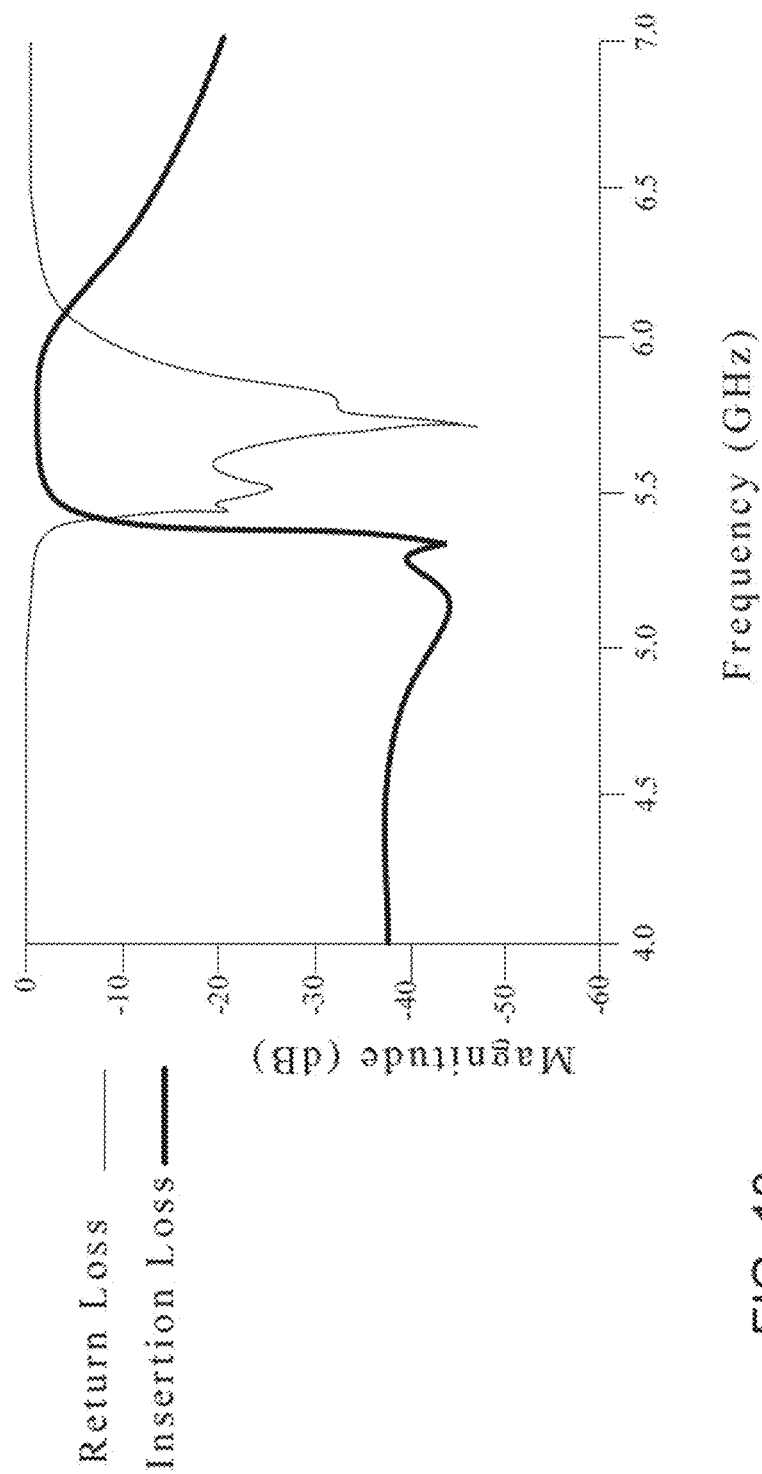
FIG. 13 shows a third frequency response graph of the coupled resonator filter.
Figure 14:
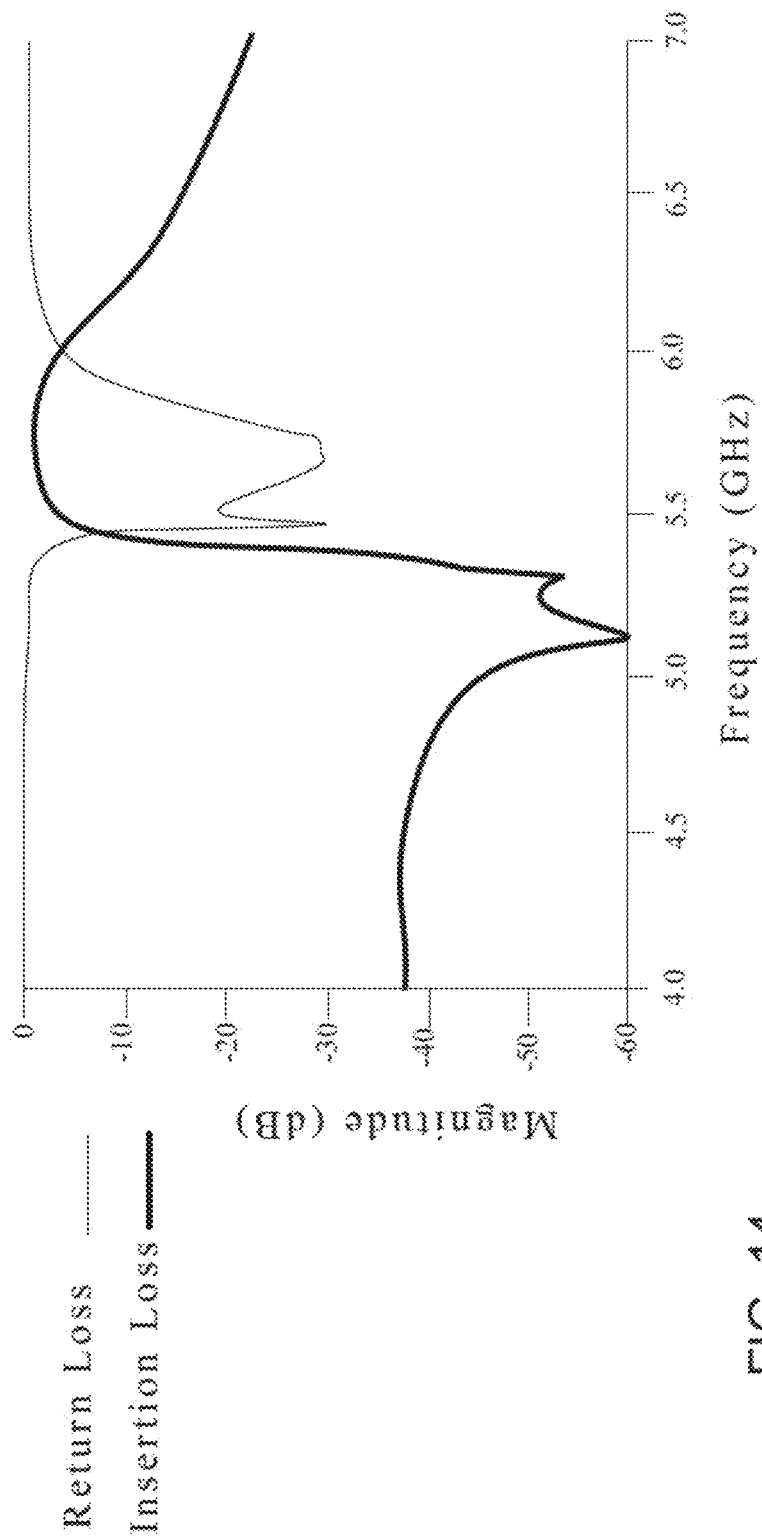
FIG. 14 shows a fourth frequency response graph of the coupled resonator filter.

FIG. 10 shows a third stereo view of a second embodiment of the coupled resonator filter, and FIG. 11 shows a second equivalent diagram view of a second embodiment of the coupled resonator filter. After comparing FIG. 11 with FIG. 6, it is able to know that, FIG. 11 shows a circuit diagram of FIG. 6 plus the output capacitor CO' and the input capacitor CIN'. Moreover, FIG. 12 shows a fourth stereo view of a second embodiment of the coupled resonator filter. After comparing FIG. 12 with FIG. 10, it is able to know that, FIG. 12 shows a stereo view of the coupled resonator filter 1 of FIG. 10 plus the plurality of shielding conductive layer SS1 and the plurality of first shielding conductive columns SS2. Moreover, FIG. 13 shows a third frequency response graph of the coupled resonator filter, and FIG. 14 shows a fourth frequency response graph of the coupled resonator filter. Particularly, FIG. 13 shows a plot of the insertion loss and return loss of the coupled resonant filter without the plurality of shielding conductive layer SS1 and the plurality of first shielding conductive columns SS2 at the operating frequency range, and FIG. 14 shows a plot of the insertion loss and return loss of the coupled resonant filter with the plurality of shielding conductive layer SS1 and the plurality of first shielding conductive columns SS2 at the operating frequency range. After comparing FIG. 14 with FIG. 13, it is able to know that, the inhibition rate of noise signal shown in FIG. 14 is better than the inhibition rate of noise signal shown in FIG. 13 with a frequency range from 5 GHz to 5.5 GHz.

It is worth noting that, according to the high isolation of the present invention, the size of the coupled resonator filter 1 has been greatly reduced. For instance, the height of the coupled resonator filter of the present invention at the operating frequency range around 5 GHz is less than 2 mm, the required height of the conventional filter at the operating frequency range around 5 GHz is 5.675 mm.

Therefore, through above descriptions, all embodiments and their constituting elements of the coupled resonator filter with high quality factor proposed by the present invention have been introduced completely and clearly; in summary, the present invention includes the advantages of:

(1) The coupled resonator filter 1 of the present invention comprises: an input capacitor CIN', a first resonance unit LC1', a second resonance unit LC2', a main adjustment unit A1' and an output capacitor CO'. Wherein the input capacitor CIN' has a first end and second end, and the first end and the second end are coupled to the first resonance unit LC1' and an input end N', respectively. Moreover, the second resonance unit LC2' is electrically connected between the first resonance unit LC1' and an output end O'. It is worth noting that, the main adjustment unit A1' is electrically connected between the first resonance unit LC1' and the second resonance unit LC2', and comprises an adjustable capacitor AC'. By such arrangements, the user be able to adjust the coupling coefficient between the first resonance unit LC1' and the second resonance unit LC2' by changing and adjusting a capacitance of the adjustable capacitor AC', such that a center frequency and/or a frequency bandwidth of the coupled resonator filter is therefore adjusted. As a result, the pole frequency of the coupled resonator filter 1 of the present invention can be adjusted to inhibit noise signal of different region more effectively, thereby letting the coupled resonator filter of the present invention with high controllability of the frequency bandwidth and high inhibition rate of noise signal.

(2) The plurality of shielding conductive layer SS1 and the plurality of first shielding conductive columns SS2 of the present invention effectively adjust the amount of mutual inductance between two resonance unit, and appropriately isolate the excess mutual inductance, thereby letting the coupled resonator filter with high isolation. According to the high isolation of the present invention, the size of the coupled resonator filter 1 has been greatly reduced. For instance, the height of the coupled resonator filter of the present invention at the operating frequency range around 5 GHz is less than 2 mm. Therefore, the coupled resonator filter 1 of the present invention has the advantage of miniaturization.

The above description is made on embodiments of the present invention. However, the embodiments are not intended to limit scope of the present invention, and all equivalent implementations or alterations within the spirit of the present invention still fall within the scope of the present invention.

What is claimed is:

1. A coupled resonator filter, comprising:
  a first resonance unit, being coupled to an input end, and comprising:
    a first resonance inductor, being coupled to a ground unit by a first end thereof; and
    a first capacitor, having a first end and a second end, and the first end and the second end being coupled to a second end of the first resonance inductor and the ground unit, respectively;
  a second resonance unit, being electrically connected between the first resonance unit and an output end, and comprising:
    a second resonance inductor, being coupled to the ground unit by a first end thereof; and
    a second capacitor, having a first end and a second end, and the first end and the second end are coupled to a second end of the second resonance inductor and the ground unit, respectively;
    wherein a first signal transmitted in the first resonance inductor is coupled to the second resonance inductor of the second resonance unit; and
  a main adjustment unit, being electrically connected between the first resonance unit and the second resonance unit, and comprising an adjustable capacitor;
  wherein the first resonance unit, the second resonance unit and the main adjustment unit are integrated in a main body, and the input end and the output end are extended out of the main body;
  wherein the first resonance inductor and the second resonance inductor are both consisted of a plurality of conductive connection columns;
  wherein by changing a capacitance of the adjustable capacitor, a coupling coefficient between the first resonance unit and the second resonance unit is adjusted, such that a center frequency and/or a frequency bandwidth of the coupled resonator filter is therefore adjusted;
  an input capacitor, having a first end and a second end, and the first end and the second end are coupled to the first resonance unit and the input end, respectively; and
  an output capacitor, having a first end and a second end, and the first end and the second end are coupled to the second resonance unit and the output end, respectively;
  wherein the input capacitor and the output capacitor are also integrated in the main body,
  wherein there are an input plate and an output plate attached onto two opposite sides of the main body that is consisted of a plurality of dielectric plates, and the plurality of dielectric plates comprising:
    a first plate having a first ground layer thereon;
    a second plate, being stacked on the first plate, and having a first conductive layer and a second conductive layer thereon, wherein a plurality of first conductive columns is disposed on the first conductive layer, and a plurality of second conductive columns is disposed on the second conductive layer;
    a third plate, being stacked on the second plate, and having a third conductive layer, a fourth conductive layer, a first capacitance layer, a second capacitance layer, and a third capacitance layer thereon, wherein a plurality of third conductive columns is disposed on the third conductive layer, and a plurality of fourth conductive columns is disposed on the fourth conductive layer; and
    a fourth plate, being stacked on the third plate, and being provided with a second ground layer, a plurality of fifth conductive columns and a plurality of sixth conductive columns thereon;
  wherein the plurality of first conductive columns, the plurality of third conductive columns and the plurality of fifth conductive columns are connected to each other for equivalently forming the first resonance inductor of the first resonance unit;

wherein the plurality of second conductive columns, the plurality of fourth conductive columns and the plurality of sixth conductive columns are connected to each other for equivalently forming the second resonance inductor of the second resonance unit;

wherein the first capacitance layer, the input plate and first conductive layer are equivalently formed as the input capacitor;

wherein the first capacitance layer and first ground layer are equivalently formed as the first capacitor of the first resonance unit;

wherein the second capacitance layer and first ground layer are equivalently formed as the second capacitor of the second resonance unit;

wherein the third capacitance layer, the output plate and the second conductive layer are equivalently formed as the output capacitor; and wherein the second capacitance layer, the first conductive layer and the second conductive layer are equivalently formed the adjustable capacitor.

2. The coupled resonator filter of claim 1, further comprising:

a plurality of resonance elements, being coupled between the first resonance unit and the second resonance unit; and a plurality of adjustment units, each of the plurality of adjustment units being electrically connected between two of the resonance elements, between the resonance elements and the first resonance unit, and between the resonance elements and the second resonance unit, respectively;

wherein each of the resonance units has a capacitor and an inductor that is in parallel with the capacitor.

3. The coupled resonator filter of claim 1, wherein the second capacitance layer equivalently forms a main inductor of the main adjustment unit, and the main inductor being electrically connected with the adjustable capacitor in parallel.

4. The coupled resonator filter of claim 1, further comprising:

a plurality of peripheral plates, being attached on the forgoing two opposite sides of the main body; and two connection plates, being connected between the first ground layer of the first plate and the second ground layer of the fourth plate, such that the first ground layer and the second ground layer are equivalently formed the ground unit.

5. The coupled resonator filter of claim 1, wherein the plurality of dielectric plates further comprise:

at least one extra plate, each of the extra plate having a fifth conductive layer, a sixth conductive layer thereon, wherein a plurality of seventh conductive columns are disposed on the fifth conductive layer, and a plurality of eighth conductive columns being disposed on the sixth conductive layer;

wherein the plurality of first conductive columns, the plurality of third conductive columns, the plurality of fifth conductive columns and the plurality of seventh conductive columns are connected to each other for equivalently forming the first resonance inductor of the first resonance unit;

wherein the plurality of second conductive columns, the plurality of fourth conductive columns, the plurality of sixth conductive columns and the plurality of eighth conductive columns being connected to each other for equivalently forming the second resonance inductor of the second resonance unit.

6. The coupled resonator filter of claim 5, wherein the plurality of dielectric plates further comprise at least one shield plate that is located between the third plate and the fourth plate, and each of the shield plate comprising a seventh conductive layer, an eighth conductive layer and a shielding conductive layer, wherein a plurality of ninth conductive columns are disposed on the seventh conductive layer, and a plurality of tenth conductive columns being disposed on the eighth conductive layer; a plurality of first shielding conductive columns being disposed on the shielding conductive layer;

wherein the plurality of first conductive columns, the plurality of third conductive columns, the plurality of fifth conductive columns, the plurality of seventh conductive columns and the plurality of ninth conductive columns being connected to each other for equivalently forming the first resonance inductor of the first resonance unit;

wherein the plurality of second conductive columns, the plurality of fourth conductive columns, the plurality of sixth conductive columns, the plurality of eighth conductive columns and the plurality of tenth conductive columns being connected to each other for equivalently forming the second resonance inductor of the second resonance unit;

wherein the fourth plate further has a plurality of second shielding conductive columns, and the second shielding conductive columns being connected to the plurality of first shielding conductive columns.

7. The coupled resonator filter of claim 6, wherein each of the plurality of the dielectric plates is a ceramic substrate.

* * * * *